(12) United States Patent
Zwieback et al.

(10) Patent No.: US 9,322,110 B2
(45) Date of Patent: *Apr. 26, 2016

(54) VANADIUM DOPED SIC SINGLE CRYSTALS AND METHOD THEREOF

(71) Applicant: II-VI Incorporated, Saxonburg, PA (US)

(72) Inventors: Ilya Zwieback, Township of Washington, NJ (US); Thomas E. Anderson, Morristown, NJ (US); Avinash K. Gupta, Basking Ridge, NJ (US); Michael C. Nolan, Andover, NJ (US); Bryan K. Brouhard, Budd Lake, NJ (US); Gary E. Ruland, Morris Plains, NJ (US)

(73) Assignee: II-VI Incorporated, Saxonburg, PA (US)

( * ) Notice: Subject to any disclaimer, the term of this patent is extended or adjusted under 35 U.S.C. 154(b) by 6 days.

This patent is subject to a terminal disclaimer.

(21) Appl. No.: 14/064,604

(22) Filed: Oct. 28, 2013

(65) Prior Publication Data

US 2014/0234194 A1  Aug. 21, 2014

Related U.S. Application Data

(60) Provisional application No. 61/767,318, filed on Feb. 21, 2013.

(51) Int. Cl.
| C30B 23/02 | (2006.01) |
| C30B 29/36 | (2006.01) |
| C30B 23/00 | (2006.01) |

(52) U.S. Cl.
CPC .................. *C30B 23/02* (2013.01); *C30B 23/00* (2013.01); *C30B 29/36* (2013.01)

(58) Field of Classification Search
None
See application file for complete search history.

(56) References Cited

U.S. PATENT DOCUMENTS

| 5,611,955 | A  | 3/1997  | Barrett et al.     |
| 5,667,587 | A  | 9/1997  | Glass et al.       |
| 5,683,507 | A  | 11/1997 | Barrett et al.     |
| 5,746,827 | A  | 5/1998  | Barrett et al.     |
| 5,985,024 | A  | 11/1999 | Balakrishna et al. |
| 6,056,820 | A  | 5/2000  | Balakrishna et al. |
| 6,329,088 | B1 | 12/2001 | Landini et al.     |
| 6,410,433 | B1 | 6/2002  | Hautala et al.     |
| 6,641,938 | B2 | 11/2003 | Landini et al.     |

(Continued)

FOREIGN PATENT DOCUMENTS

| EP | 0835336 B2   | 4/1998 |
| EP | 0859879 B2   | 8/1998 |
| JP | 2010150133 A | 7/2010 |
| WO | 2010111473 A1| 9/2010 |

OTHER PUBLICATIONS

Chaussende et al., "Continuous Feed Physical Vapor Transport Toward High Purity and Long Boule Growth of SiC", J. Electrochem. Soc. 2003, vol. 150, issue 10, pp. G653-G657.

Krishnan et al., "Vanadium doping using VCl4 source during the chloro-carbon epitaxial growth of 4H-SiC", Journal of Crystal Growth, 2011, pp. 8-14, vol. 321.

Landini et al., "CVD Growth of Semi-Insulating 4H-SiC Epitaxial Layers by Vanadium Doping", 39th Electronic Materials Conference, Jun. 25-27, 1997, Fort Collins, Colorado.

(Continued)

*Primary Examiner* — Guinever S Gregorio
(74) *Attorney, Agent, or Firm* — The Webb Law Firm (57) ABSTRACT

A sublimation grown SiC single crystal includes vanadium dopant incorporated into the SiC single crystal structure via introduction of a gaseous vanadium compound into a growth environment of the SiC single crystal during growth of the SiC single crystal.

9 Claims, 7 Drawing Sheets

(56) References Cited

U.S. PATENT DOCUMENTS

| | | | |
|---|---|---|---|
| 6,805,745 | B2 | 10/2004 | Snyder et al. |
| 7,608,524 | B2 * | 10/2009 | Gupta et al. .................. 438/478 |
| 7,767,022 | B1 * | 8/2010 | Gupta ..................... C30B 23/00 117/105 |
| 8,216,369 | B2 | 7/2012 | Gupta et al. |
| 8,361,227 | B2 | 1/2013 | Zwieback et al. |
| 2005/0255245 | A1 | 11/2005 | Fanton et al. |
| 2006/0243984 | A1 * | 11/2006 | Gupta ..................... C30B 23/00 257/77 |
| 2008/0190355 | A1 | 8/2008 | Chen et al. |
| 2010/0018455 | A1 | 1/2010 | Gupta et al. |
| 2010/0159182 | A1 | 6/2010 | Straubinger et al. |
| 2011/0300323 | A1 * | 12/2011 | Straubinger et al. ......... 428/64.1 |
| 2011/0303884 | A1 | 12/2011 | Gupta et al. |
| 2012/0103249 | A1 * | 5/2012 | Gupta ..................... C30B 29/36 117/89 |

OTHER PUBLICATIONS

Landini et al., "Vanadium Precursors for Semi-Insulating SiC Epilayers", 1998 DoD-MDA SBIR/STTR Phase I Award ID: 41218.

Muller et al., "Growth of Silicon Carbide Bulk Crystals with a Modified Physical Vapor Transport Technique", Chem. Vap. Deposition 2006, vol. 12, pp. 557-561.

Polyakov et al., "Halide—CVD Growth of Bulk SiC Crystals", Materials Science Forum 2006, vols. 527-529, pp. 21-26.

Song et al., "Homoepitaxial Growth of Vanadium-Doped Semi-insulating 4H-SiC Using Bis-trimethylsilylmethane and Bis-cyclopentadienylvanadium Precursors", J. Electrochem. Soc. 2008, vol. 155, issue 1, pp. H11-H16.

Straubinger et al., "Aluminum p-type doping of silicon carbide crystals using a modified physical vapor transport growth method", J. Cryst. Growth 240 (2002), pp. 117-123.

Wijesundara et al., "Silicon Carbide Microsystems for Harsh Environments", Chapter 2: SiC Materials and Processing Technology, Springer Science and Business Media, LLC 2011, pp. 33-96.

* cited by examiner

VANADIUM DOPED SIC SINGLE CRYSTALS AND METHOD THEREOF

CROSS REFERENCE TO RELATED APPLICATION

The present invention claims priority from U.S. Provisional Patent Application No. 61/767,318, filed Feb. 21, 2013, the disclosure of which is hereby incorporated in its entirety by reference.

BACKGROUND OF THE INVENTION

1. Field of the Invention

The present invention relates to silicon carbide (SiC) single crystals and, more particularly, to a method of fabricating SiC single crystals using a gaseous source of deep level dopant.

2. Description of Related Art

Single crystals of silicon carbide of 4H and 6H polytypes serve as lattice-matched substrates in SiC- and AlGaN-based semiconductor devices, including ultra-high-frequency AlGaN-based transistors and SiC-based devices for power switching. Other applications include ultra-fast photoconductive switches, sensors for harsh environments, radiation detectors and many others. In the cases of high-frequency devices and photoconductive switches, the SiC substrates must be semi-insulating, that is having very high electric resistivity.

In the past, the term 'semi-insulating' in application to SiC meant simply that the crystal resistivity was above $1 \cdot 10^5$ Ohm-cm. In more stringent terms, 'semi-insulating' is a synonym for 'fully compensated'. Many of the present day semiconductor devices built on SiC substrates require the substrate to have a resistivity on the order of $10^{10}$-$10^{11}$ Ohm-cm or higher.

Compensation of silicon carbide with vanadium is well known and has been used to produce SiC single crystals having high electric resistivity. The Prior Art related to vanadium doping includes U.S. Pat. Nos. 5,611,955; 7,608,524; 8,216,369; US 2008/0190355 and US 2011/0303884, which are all incorporated herein by reference. Vanadium produces two deep levels in the SiC bandgap, one deep acceptor and one deep donor, and, therefore, can electronically compensate either shallow donors (when they dominate over shallow acceptors), or shallow acceptors (when they dominate over shallow donors).

Figure 1:
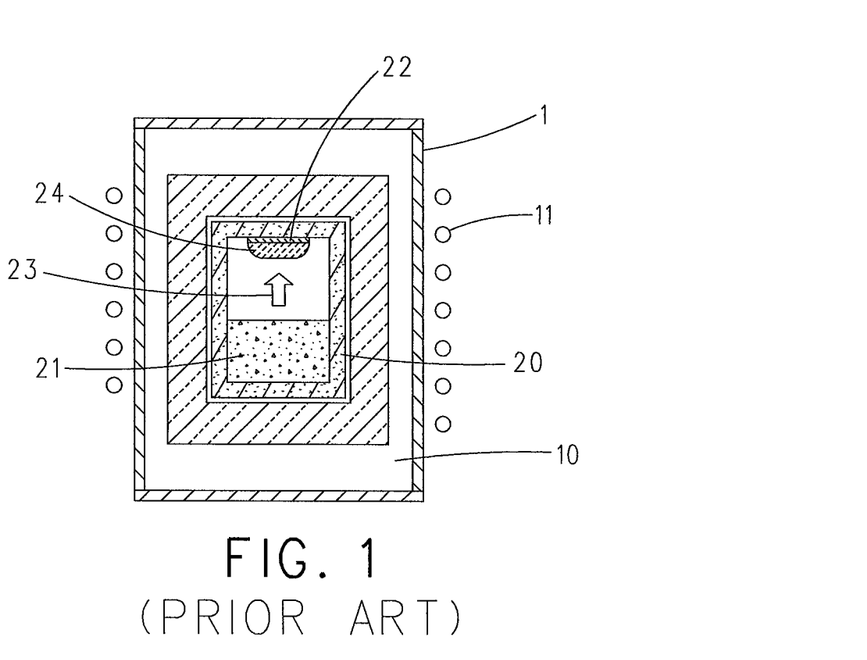
FIG. 1 is a schematic drawing of a prior art conventional physical vapor transport (PVT) growth system including a growth crucible inside of a furnace chamber.

Large-size commercial SiC single crystals are commonly grown by the sublimation technique of Physical Vapor Transport (PVT). A simplified schematic diagram of conventional PVT system is shown in FIG. 1, wherein a double-wall, water-cooled furnace chamber 1 is desirably made of fused silica. A PVT crystal growth cell is disposed inside furnace chamber 1. The PVT growth cell includes crystal growth crucible 20 charged with polycrystalline SiC grain 21 (SiC source) and a SiC single crystal seed 22 in spaced relationship. Commonly, SiC source 21 is disposed at the bottom of growth crucible 20, while SiC seed 22 is disposed at the top of growth crucible 20. Desirably, growth crucible 20 is made of dense, fine-grain graphite.

Conventionally, inductive type of heating is employed in PVT growth of silicon carbide. This type of heating is shown in FIG. 1 by RF coil 11 which is disposed outside the chamber 1. Graphite growth crucible 20 serves as an RF susceptor which couples electromagnetically to an RF field produced by excitation of RF coil 11. Growth crucible 20 is surrounded by thermal insulation 10 which is usually made of lightweight porous graphite, such as graphite felt or fibrous graphite board. These thermally insulating materials do not couple substantially to the RF field of RF coil 11. Resistive-type heating (in place of or in addition to RF coil 11), different types of thermal insulation, furnace chambers made of stainless steel, and RF coils disposed inside the chamber can also or alternatively be successfully employed for SiC sublimation growth. Other common and ordinary parts of the PVT crystal growth apparatus, such as gas and vacuum lines, valves, pumps, electronic controls, etc. are not shown in FIG. 1.

In preparation for PVT growth, chamber 1 is loaded with growth crucible 20 charged with SiC source 21 and SiC seed 22, and thermal insulation 10. Chamber 1 and, hence, growth crucible 20 are then evacuated and filled with a process gas (most commonly argon) to a desired pressure—generally between several and 100 Torr. Following this, growth crucible 20 is heated via energized RF coil 11 to growth temperature, which is generally between 2000° C. and 2400° C. Growth crucible 20 is heated such that a vertical temperature gradient is created between SiC source 21 and SiC seed 22, with the temperature of SiC source 21 higher than that of SiC seed 22.

At high temperatures, SiC source 21 sublimes releasing into the atmosphere of growth crucible 20 a spectrum of volatile molecular species, such as Si, $Si_2C$ and $SiC_2$. Driven by the vertical temperature gradient, these species migrate to SiC seed 22 (vapor transport in FIG. 1 is shown by arrow 23) and condense on it causing growth of SiC single crystal 24 on SiC seed 22. Prior art in the area of PVT growth of silicon carbide includes U.S. Pat. Nos. 6,805,745; 5,683,507; 5,667,587 and 5,746,827, which are all incorporated herein by reference.

In the past, vanadium-doped SiC crystals (such as SiC crystal 24) were obtained by admixing a small amount of solid vanadium dopant directly to the SiC source (such as SiC source 21), as disclosed in U.S. Pat. No. 5,611,955 and US 2008/0190355, both of which are incorporated herein by reference. This solid vanadium dopant could be in the form of elemental metallic vanadium or in the form of a solid vanadium compound such as vanadium carbide. A major disadvantage of this type of vanadium doping is the physical contact between the solid vanadium dopant and the SiC source 21. Specifically, at high temperatures, multi-step chemical reactions take place between the vanadium and the SiC source 21 leading to the formation of multiple intermediary compounds, such as vanadium carbides, silicides, carbo-silicides and various eutectic compositions. This makes the partial vapor pressure of the vanadium comprising the volatile molecular species unstable and varying with time, and leads to spatially nonuniform vanadium doping of the grown SiC crystal (such as SiC crystal 24).

The aforementioned problem of spatially nonuniform vanadium doping was addressed in U.S. Pat. Nos. 7,608,524; 8,216,369 and US 2011/0303884, which are all incorporated herein by reference, wherein vanadium doping was accomplished by disposing the source of vanadium inside a doping capsule made of an inert material thus eliminating direct contact between the vanadium source and the SiC source 21. This doping arrangement is shown in FIG. 2.

Figure 2:
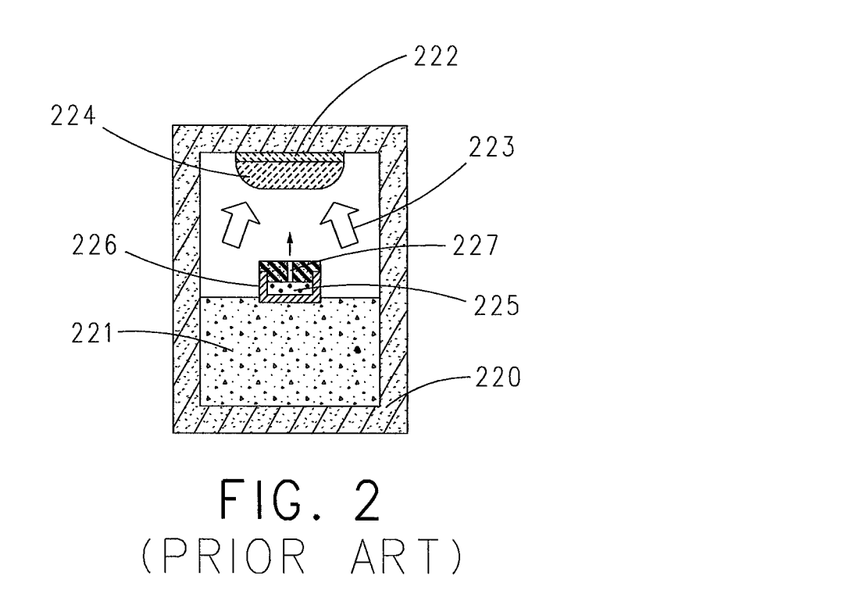
FIG. 2 is an isolated schematic drawing of a prior art growth crucible (like the growth crucible shown in FIG. 1) including a prior art inert capsule charged with a dopant.

With reference to FIG. 2, vanadium solid dopant 225 is included in an inert capsule 226 which, generally, is made of graphite. Capsule 226 includes at least one calibrated capillary 227 of predetermined diameter and length. Each capillary 227 allows controlled effusion of vanadium vapor from capsule 226. Doping capsule 226 can be placed on the surface of SiC source 221, as illustrated in FIG. 2, beneath SiC source 221 (on the bottom of growth crucible 220), or buried in the bulk of SiC source 221. FIG. 2 also shows vapor transport 223 of volatile molecular species to SiC seed 222 where the species condense on SiC seed 222 causing growth of SiC single crystal 224 on SiC seed 222.

Implementation of doping capsule 226 improved the uniformity of vanadium doping, but only for vanadium concentrations around $1 \cdot 10^{17}$ atoms-$cm^{-3}$ and around $1 \cdot 10^{16}$ atoms-$cm^{-3}$. This was due to the fact that the temperature of the solid vanadium source 225 could not be controlled independently. Accordingly, the partial pressure of vanadium inside growth crucible 220 could not be controlled independently as well. Therefore, when elemental vanadium was used in doping capsule 226 as a vanadium doping source 225, the vanadium concentration in the crystal was about $1 \cdot 10^{17}$ atoms-$cm^{-3}$. However, when vanadium carbide (VC) was used in doping capsule 226 as a vanadium doping source 225, the vanadium concentration in the crystal was about $1 \cdot 10^{16}$ atoms-$cm^{-3}$. Thus, vanadium concentrations between $1 \cdot 10^{16}$ atoms-$cm^{-3}$ and $1 \cdot 10^{17}$ atoms-$cm^{-3}$ or vanadium concentrations below $1 \cdot 10^{16}$ atoms-$cm^{-3}$ could be achieved reliably.

Gas-assisted PVT processes are known generally in the art. Such PVT processes include: APVT, HTCVD, HCVD, CF-PVT and M-PVT. All these modifications of SiC sublimation growth were created with the aim of achieving better crystal purity, longer growth cycle, steady-state growth, control over the vapor phase stoichiometry, and improved doping.

Figure 3:
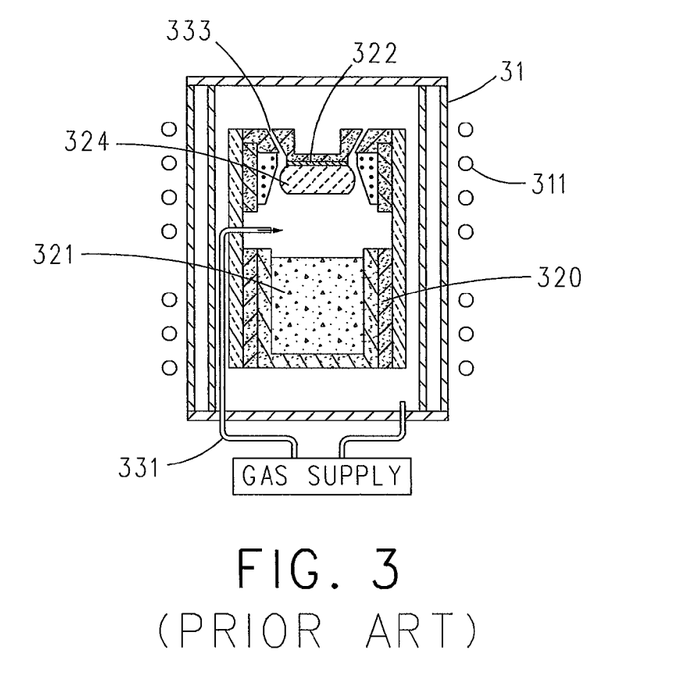
FIGS. 3-6 are schematic drawings of prior art APVT, HTCVT, HCVD, and CF-PVT growth cells.

Advanced PVT (APVT). FIG. 3 is a schematic representation of an APVT growth cell, e.g., of the type disclosed in U.S. Pat. No. 5,985,024. In APVT growth, pure silicon 321 is included at the bottom of growth crucible 320 and melted upon heating. A gaseous carbon precursor (propane, $C_3H_8$) is introduced via a gas conduit 331. This carbon-bearing gas precursor 331 reacts with silicon vapor emanating from the molten silicon 321. The products of reaction migrate towards SiC seed 322 and precipitate on it causing growth of SiC single crystal 324 on SiC seed 322. Gaseous byproducts leave the crucible through open passages 333. FIG. 3 also shows chamber 31 (similar to chamber 1) and RF coil 311 (similar to RF coil 11).

Figure 4:
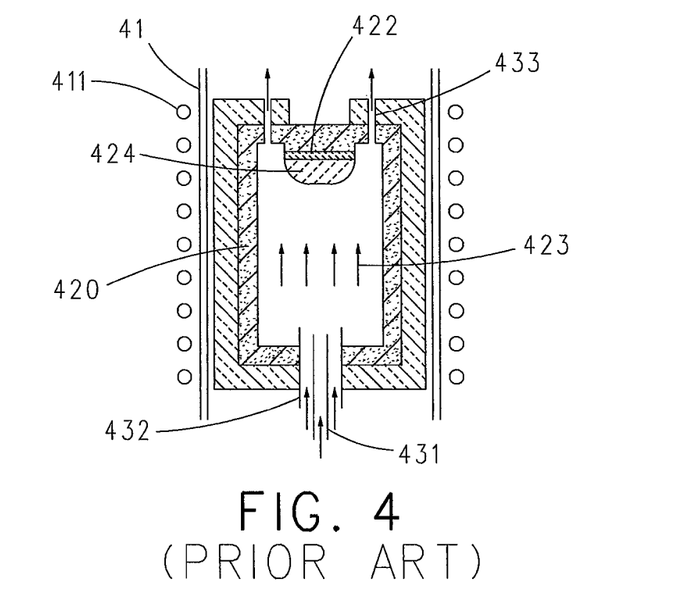

High Temperature CVD (HTCVD). FIG. 4 is a schematic diagram of a HTCVD SiC growth cell. Details regarding HTCVD growth can be found in M. B. J. Wijesundara and R. Azevedo, "Silicon Carbide Microsystems for Harsh Environments", Chapter 2: SiC Materials and Processing Technology, pp. 40-44. Springer Science and Business Media, LLC 2011, EP 0835336 and EP 0859879. Silicon and carbon gaseous precursor gases, namely, silane and propane, respectively, are input into crucible 420 via coaxial inlets 431 and 432. Once inside crucible 420, silane undergoes thermal dissociation leading to the formation of Si clusters. These Si clusters react with the carbon precursor gas and form $Si_xC_y$ clusters. Driven by a vertical vapor transport 423, the $Si_xC_y$ clusters enter a higher-temperature zone, where they, in similarity to the conventional PVT, sublimate to form Si and C including vapor species, such as Si, $SiC_2$ and $Si_2C$. These species migrate towards SiC seed 422 and precipitate on SiC seed 422 causing growth of SiC single crystal 424 on SiC seed 422. Gaseous byproducts leave the crucible through open passages 433. FIG. 4 also shows chamber 41 (similar to chamber 1) and RF coil 411 (similar to RF coil 11).

Figure 5:
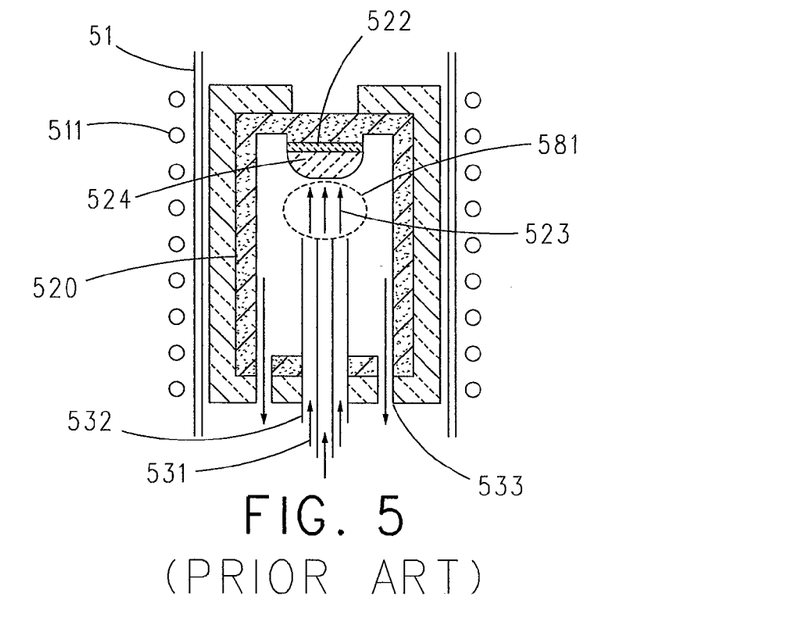

Halide CVD (HCVD). A HCVD growth cell is shown schematically in FIG. 5. Details regarding the HCVD growth can be found in A. Polyakov et al. "Halide-CVD Growth of Bulk SiC Crystals", J. Mat. Sci. Forum (2006) Vol. 527-529, 21-26. Fanton et al. US 2005/0255245 "Method and Apparatus for the Chemical Vapor Deposition of Materials". The HCVD growth process is similar to the HTCVD growth process, with the exception of different chemical reactions involved due to the presence of halogen (chlorine) in the system. A chlorinated silicon precursor ($SiCl_4$ diluted by Ar) and a carbon precursor ($C_3H_8$ or $CH_4$ diluted by $H_2$/Ar) are supplied upward into crucible 520 via coaxial inlets 531 and 532, respectively. At high temperatures and while still inside inlets 531 and 532, these precursors dissociate yielding gaseous molecules of $SiCl_2$ and $C_2H_2$. In a mixing zone 581, which is situated near SiC seed 522, $SiCl_4$, $SiCl_2$, $C_2H_2$ and $H_2$ react in the gas phase according to the following summary equation (written without stoichiometric coefficients):

$$SiCl_2(g)+SiCl_4(g)+C_2H_2(g)+H_2(g) \Rightarrow SiC(s)+SiCl(g)+HCl(g)$$

The net effect of the above reaction is precipitation of solid SiC on SiC seed 522 and growth of a SiC single crystal 524 on SiC seed 522. Gaseous byproducts (HCl, SiCl) and carrier gases (Ar, $H_2$) leave crucible 520 through the open bottom passages 533. FIG. 5 also shows crucible 51 (similar to crucible 1) and RF coil 511 (similar to RF coil 11).

Figure 6:
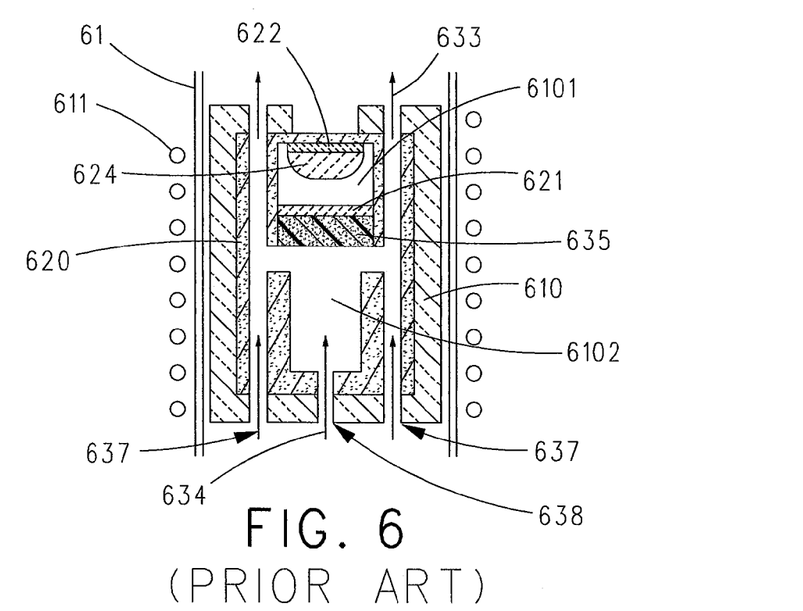

Continuous Feed PVT (CF-PVT). A CF-PVT growth cell is shown in FIG. 6. Details regarding CF-PVT growth can be found in D. Chaussende et al. "Continuous Feed Physical Vapor Transport Toward High Purity and Long Boule Growth of SiC". J. Electrochem. Soc. 2003, Vol. 150, issue 10, G653-G657. The method of CF-PVT growth is a hybrid between the PVT and HTCVD growth processes. The CF-PVT growth cell is divided into two zones: PVT zone 6101 and HTCVD zone 6102, said zones separated by graphite foam 635 which supports SiC source 621. Tetramethylsilane (TMS) 634 including both silicon and carbon is used as a single gaseous SiC precursor. TMS 634 is input into crucible 610 via inlet 638 by a flow of argon carrier gas. In order to dilute and remove reaction products from the growth cell, pure argon is supplied through lateral inlets 637. Thermal dissociation of TMS 634 occurs in HTCVD zone 6102 and leads to the formation of microscopic SiC clusters. These SiC clusters are transported by the argon flow to a higher-temperature sublimation zone where they vaporize. These vapors diffuse through porous graphite foam 635 and feed solid SiC source 621 disposed on foam 635. The solid SiC source 621 vaporizes leading to the growth of SiC single crystal 624 on SiC seed 622. Gaseous byproducts from the HTCVD zone 6102 leave crucible 610 through open passages 633. FIG. 6 also shows chamber 61 (similar to chamber 1) and RF coil 611 (similar to RF coil 11).

Figure 7A:
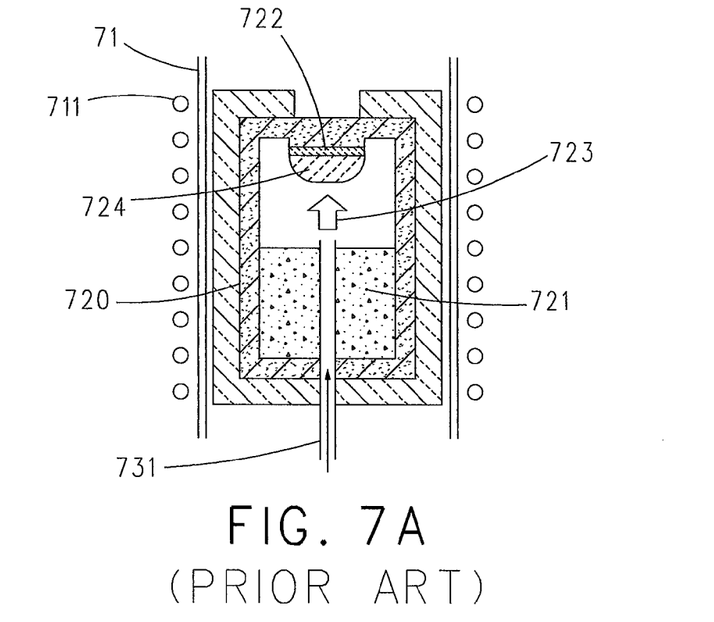
FIG. 7A is a schematic drawing of a prior art M-PVT growth cell.
Figure 7B:
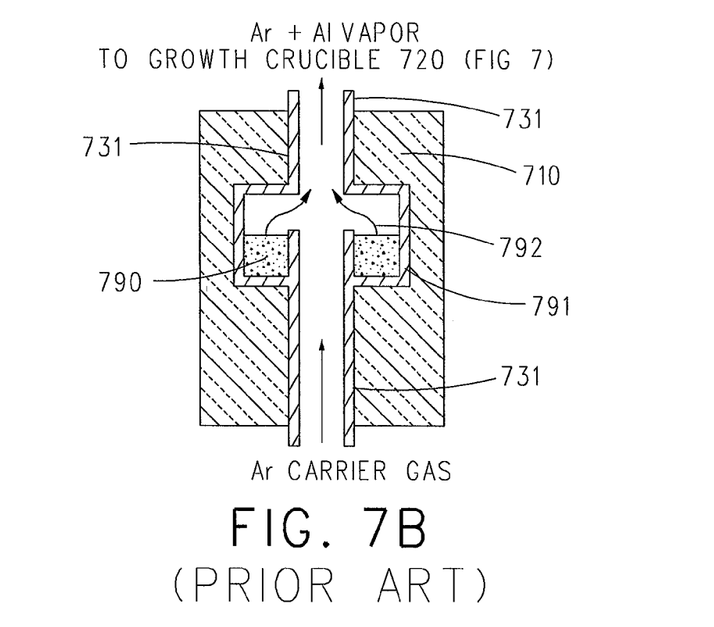
FIG. 7B is a schematic view of dopant contained in a prior art external reservoir that, in one embodiment of FIG. 7A, can be connected to a gas conduit of the M-PVT growth cell shown in FIG. 7A.

Modified PVT Method (M-PVT). A M-PVT cell is shown in FIG. 7A. Details regarding M-PVT growth can be found in R. Muller et al., "Growth of SiC Bulk Crystals with a Modified PVT Technique", Chem. Vap. Deposition (2006), 12, 557-561. In essence, the M-PVT growth method is a PVT process with the added capability of delivering small amounts of Si and/or C gaseous precursors and/or dopants into a growth crucible 720 via a gas conduit 731. The M-PVT growth method has been used for the growth of aluminum-doped SiC crystals. See T. L. Straubinger et al. "Aluminum p-type doping of SiC crystals using a modified physical vapor transport growth method". J. Cryst. Growth 240 (2002) 117-123. In one embodiment of M-PVT, trimethylaluminum (TMA) is used as a gaseous Al precursor supplied via a gas conduit 731. In another embodiment of M-PVT shown in FIG. 7B, elemental aluminum 790 is included in an external reservoir 791 connected to gas conduit 731 (FIG. 7A). The temperature of reservoir 791 is controlled by placing it at a pre-determined distance from growth crucible 720. The temperature of reservoir 791 is sufficiently high to melt aluminum and generate aluminum (Al) vapors 792 which are delivered into the growth crucible 720 with the flow of argon. FIG. 7A also shows chamber 71 (similar to chamber 1) and RF coil 711 (similar to RF coil 11).

The above-cited prior art gas-assisted PVT techniques had potential advantages, such as superior purity and stoichiometry control, but also had limitations and drawbacks. In the cases of APVT, HTCVD, HCVD and CF-PVT growth, the drawback is the open nature of the growth crucible. In all of the aforementioned processes, the presence of open passages leads to severe losses of vapors and gases and to very low crystallization efficiency. In the case of M-PVT (FIG. 7A), the drawback is interference by the gas flow or vertical vapor transport 723 coming from gas conduit 731 with the growth of SiC single crystal 724. These and other drawbacks avoided these techniques from becoming viable commercial competitors to standard PVT sublimation growth.

Vanadium doping of SiC using vanadium gaseous precursors has been explored in 4H—SiC CVD epitaxy. Ferrocene-type vanadium metalorganic compounds have been used in CVD SiC epitaxy carried out at 1370-1440° C. See H. Song et al., "Homoepitaxial Growth of Vanadium-Doped Semi-Insulating 4H—SiC Using Bis-Trimethylsilymethane and Bis-Cyclopentadienylvanadium Precursors". J. Electrochem. Soc. 155 (2008) p. H11-H16. The ferrocene bath (bubbler) was maintained at temperatures between 50° C. and 110° C., and $H_2$ was used as a carrier gas flowing at a rate of 10 sccm. In the epilayers grown at 1440° C., the maximum achieved resistivity was about $10^7$ Ohm-cm. In the epilayers grown at 1370° C., higher resistivity values were observed, but the epilayer quality was poor.

Organometallic vanadium precursors were used by B. Landini et al. in CVD growth of semi-insulating SiC epilayers. See Landini et al., "CVD Growth of Semi-Insulating 4H—SiC Epitaxial Layers by Vanadium Doping". Abstracts of 39$^{th}$ Electronic Materials Conference, Jun. 25-27, 1997, Fort Collins, Colo. Landini et al., "Vanadium Precursors for Semi-Insulating SiC Epilayers", 1998 DoD-MDA SBIR/STTR Phase I Award ID: 41218. Landini et al., U.S. Pat. Nos. 6,329,088 and 6,641,938. The growth temperatures were, between 1200° C. and 1700° C. No details are available on the composition of the precursors, resistivity and quality of the produced SiC epilayers.

Generally, vanadium organometallic compounds dissociate at relatively low temperatures, typically, between 200 and 300° C., leading to precipitation of solid vanadium carbide(s). Such precipitation can occur even before the precursor is delivered into the heated SiC growth (reaction) zone.

Vanadium tetrachloride ($VCl_4$) as a precursor in CVD chloro-carbon epitaxy was explored in B. Krishnan et al., "Vanadium Doping Using $VCl_4$ Source during the Chloro-Carbon Epitaxial Growth of 4H—SiC". J. Cryst. Growth, 321 (2011) pp. 8-14. The goal was to produce strongly compensated 4H—SiC epilayers. CVD growth was performed in a hot-wall CVD reactor at 1450° C. and 1600° C. with $H_2$ as a carrier gas. $CH_3Cl$ and $SiCl_4$ were used as chlorinated carbon and silicon precursors, respectively. Delivery of $VCl_4$ into the growth zone was achieved by bubbling $H_2$ through liquid $VCl_4$ maintained at 20° C. Depending on the $H_2$ flow rate, the vanadium concentration in the epilayers was between $1 \cdot 10^{16}$ atoms-$cm^{-3}$ and $(2-3) \cdot 10^{17}$ atoms-$cm^{-3}$. The highest resistivity observed was about $5 \cdot 10^5$ Ohm-cm.

It is believed that sublimation growth of vanadium-doped, bulk SiC single crystals using a gaseous vanadium source (precursor) injected into the growth cell during growth is not known in the art or obvious in view of the prior art.

SUMMARY OF THE INVENTION

Disclosed herein is a SiC sublimation crystal growth process capable of yielding semi-insulating SiC single crystals of 4H and 6H polytype uniformly doped with vanadium in a broad range of vanadium concentrations, from $10^{15}$ atoms-$cm^{-3}$ to $10^{17}$ atoms-$cm^{-3}$.

Also disclosed herein is a process for doping a growing SiC crystal with vanadium using a gaseous vanadium compound as a doping source.

Also disclosed herein are SiC single crystals of 4H and 6H polytype including spatially uniform concentrations of vanadium in the range between $10^{15}$ and $10^{17}$ atoms-$cm^{-3}$.

More specifically, disclosed herein is a method of growing vanadium-doped SiC single crystals comprising: (a) providing a growth crucible having SiC source material and a SiC single crystal seed in spaced relation therein; (b) heating the growth crucible of step (a) such that the SiC source material is heated to sublimation and a temperature gradient forms between the SiC source material and the SiC single crystal seed that causes the sublimated SiC source material to be transported to and precipitate on the SiC single crystal seed thereby growing a SiC crystal on the SiC single crystal seed; and (c) concurrent with step (b), introducing into the growth crucible a doping gas mixture that includes a carrier gas and a gaseous vanadium compound such that the growing SiC crystal is doped during the growth thereof with vanadium from the gaseous vanadium compound.

The carrier gas can include an inert gas and hydrogen. The gaseous vanadium compound can include a halogen.

The gaseous vanadium compound can be vanadium chloride ($VCl_n$), where n=2, 3, or 4. The gaseous vanadium compound can be vapors of the $VCl_n$.

The doping gas mixture of step (c) can be comprised of the $VCl_n$ vapors mixed with the carrier gas. The $VCl_n$ vapors can be mixed with the carrier gas by passage of the carrier gas through a pool of liquid $VCl_n$. The $VCl_n$ vapors can be mixed with the carrier gas outside the growth crucible.

During step (c), the gaseous vanadium compound can undergo dissociation releasing byproducts that exit the growth crucible along with the carrier gas by diffusion across a porous wall of the growth crucible. The dissociated byproducts of the gaseous vanadium compound can react with unwanted impurities in the porous wall of the growth crucible to form therewith volatile molecules that exit the growth crucible with the carrier gas diffusing across the porous wall of the growth crucible.

The carrier gas can include a halogen. The halogen can be chlorine.

The gaseous vanadium compound of step (c) can be formed by reaction between the halogen in the carrier gas and a solid vanadium source. The reaction between the halogen in the carrier gas and the solid vanadium source can occur outside the growth crucible.

Also disclosed herein is an apparatus for growing vanadium-doped SiC single crystals comprising: a growth crucible inside of a sealed chamber, the growth crucible having SiC source material and a SiC single crystal seed in spaced relation therein; a gas conduit connected to the growth crucible via the chamber and operative for delivering a doping gas mixture comprised of a carrier gas and a gaseous vanadium compound to the growth crucible; a heater for heating the growth crucible such that the SiC source material is heated to sublimation and a temperature gradient forms between the SiC source material and the SiC single crystal seed that causes the sublimated SiC source material to be transported to and precipitate on the SiC single crystal seed causing a SiC crystal to grow on the SiC single crystal seed; and a source of the gaseous vanadium compound coupled to the gas conduit.

The source of the gaseous vanadium compound is one of the following: (1) a pool of a vanadium bearing liquid through which a carrier gas flows picking-up vapors of the vanadium bearing liquid that become the gaseous vanadium compound; or (2) a compartment housing solid vanadium through which a halogen bearing carrier gas flows, wherein reaction between the halogen in the carrier gas and a solid vanadium source forms the gaseous vanadium compound.

Also disclosed herein is a sublimation grown SiC single crystal including vanadium dopant incorporated into the SiC single crystal via introduction of a gaseous vanadium compound into a growth environment of the SiC single crystal during growth of the SiC single crystal.

DETAILED DESCRIPTION OF THE INVENTION

The present invention will now be described with reference to the accompanying figures where like reference numbers correspond to like elements.

Vanadium doping from a gaseous vanadium source (precursor) is believed to have advantages over the solid vanadium sources of the prior art. A gas mixture including volatile vanadium-bearing molecules can be delivered into the growth crucible very accurately and at a desired rate. Therefore, the partial pressure of vanadium inside the growth crucible can be controlled, and SiC single crystals precisely and uniformly doped with vanadium in a broad range of vanadium concentrations can be obtained.

Figure 8:
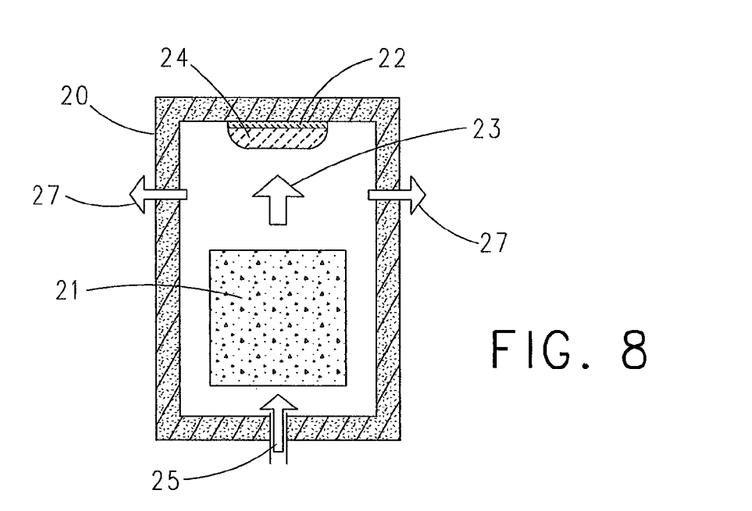
FIG. 8 is an isolated schematic view of a growth crucible charged with SiC source material and a SiC crystal in spaced relation in accordance with the principle of the present invention.

With reference to FIG. 8, gas-assisted PVT, which combines SiC sublimation growth with vanadium doping using a gaseous vanadium source, includes a graphite growth crucible 20 loaded with a SiC source 21 and a SiC single crystal seed 22 in spaced relationship typical for PVT. It is to be understood that growth crucible 20 is surrounded by insulation 10, a chamber 1, and a heating means, e.g., RF coil 11, as shown in FIG. 1. Insulation 10, chamber 1, and heating means have been omitted from FIG. 8 for simplicity.

Figure 9A:
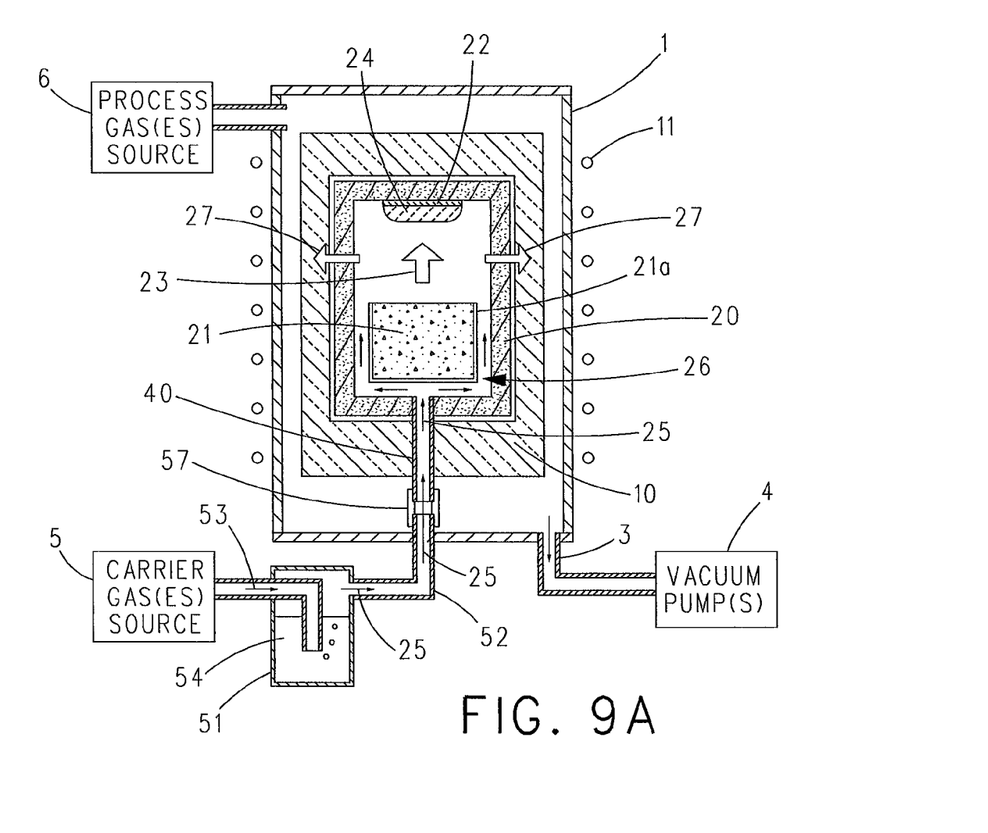
FIG. 9A is a schematic drawing of a growth system in accordance with one embodiment of the present invention.

At high temperatures of SiC sublimation growth, SiC source 21 vaporizes and generates Si- and C-bearing vapors, in similarity to the conventional PVT process. Driven by a vertical temperature gradient inside growth crucible 20 caused by the heating means, e.g., RF coil 11, these vapors migrate towards SiC seed 22. The migration of these vapors towards SiC seed 22 is illustrated in FIG. 9 by arrow 23 which represents vertical vapor transport inside of growth crucible 20. Upon approaching SiC seed 22, the vapors condense on SiC seed 22 causing growth of SiC single crystal 24 on SiC seed 22.

Simultaneously, a flow of a doping gas (arrow 25) including a gaseous vanadium compound (precursor) is introduced into growth crucible 20. At high temperatures of SiC sublimation, this gaseous vanadium precursor 25 undergoes chemical transformations in accordance with the system thermodynamics. These chemical transformations yield gaseous molecular associates that include vanadium. These gaseous molecular associates migrate towards growing SiC single crystal 24 and adsorb on the growth interface causing doping of SiC single crystal 24 with vanadium.

In similarity to the M-PVT growth process (FIG. 7A), growth crucible 20 does not have open passages for the removal of gaseous byproducts. Rather, the gaseous byproducts escape from growth crucible 20 by filtering across the porous graphite wall of growth crucible 20, as shown schematically by arrows 27.

Referring back to FIGS. 3, 4, 5 and 6, the prior art APVT, HTCVD, HCVD and CF-PVT processes required relatively high flows of gases. For instance, typical flows for the carrier gases were on the order of Liters per minute. This was the main reason why the open passages 33 were essential in the design of APVT, HTCVD, HCVD and CF-PVT growth cells. Otherwise, a dangerous raise in the gas pressure inside the growth crucible would occur.

In FIG. 8, growth crucible 20 does not have open passages for gas escape. Instead, the carrier gas and gaseous byproducts filter out of growth crucible 20 by diffusing across the porous graphite wall of growth crucible 20. In order to avoid an unwanted rise in pressure inside growth crucible 20, the flow 25 of doping gas into growth crucible 20 is kept relatively small—desirably ≤50 sccm. Gas assisted PVT using a gaseous vanadium source will now be described in more detail with reference to two embodiments.

First Embodiment

FIG. 9A shows a SiC crystal growth system in accordance with a first embodiment. In similarity to prior art PVT, growth crucible 20 is placed inside furnace chamber 1, where it is surrounded by thermal insulation 10. Growth crucible 20 is charged with SiC source grain 21 and SiC single crystal seed 22 in spaced relationship: with SiC source grain 21 disposed in the lower portion of growth crucible 20 and SiC single crystal seed 22 disposed in the upper portion of growth crucible 20. Heating of growth crucible 20 is via RF coil 11 (or other suitable heating means). Common and ordinary parts of the SiC crystal growth system of FIG. 10, such as gas and vacuum lines, valves, vacuum pumps, electronic controls, etc. are not shown for simplicity.

In similarity to the M-PVT process of FIG. 7A, a gas conduit 40 is attached to growth crucible 20. Conduit 40 can be attached at the bottom of the growth crucible 20, as shown in FIG. 9A, or, without limitation, at any other suitable location on the wall of growth crucible 20. Conduit 40 opens into the interior of growth crucible 20 and serves for the delivery of a gaseous vanadium compound (precursor) into growth crucible 20. Both growth crucible 20 and conduit 40 are desirably made from high-density, fine-grain graphite, such as grade 2020 available from Mersen USA Bay City-MI Corp., 900 Harrison Street, Bay City, Mich. 48708, grade IG-11 available from Toyo Tanso USA, Inc., 2575 NW Graham Circle, Troutdale, Oreg. 97060, or similar, without limitation. Growth crucible 20 and conduit 40 are connected in a manner known in the art, e.g., by threading. In order to reduce possible gas leaks, carbon-based thread sealants can be applied to the threaded connections.

Inside growth chamber 1 and outside growth crucible 20, gas conduit 40 is connected to a metal gas line 52 in a gas-tight fashion. This graphite-to-metal connection, which is, desirably, maintained at temperatures not exceeding 200° C., is accomplished in a manner known in the art, for instance, by using threaded metal adapters 57. Outside chamber 1, gas line 52 is connected to a temperature-controlled bubbler bath 51 that includes a volatile liquid vanadium precursor 54, such as, without limitation, vanadium tetrachloride ($VCl_4$).

In preparation for PVT growth, growth crucible 20 is loaded with SiC source 21 and SiC single crystal seed 22 and placed inside furnace chamber 1, as shown in FIG. 9A. Inside chamber 1, growth crucible 20 is surrounded by thermal insulation 10. Chamber 1 and, hence, growth crucible 20 are then evacuated via vacuum pump(s) 4, and filled with a process gas from process gas(es) source 6 to a desired pressure, e.g., between several and 100 Torr. Since the graphite forming growth crucible 20 and thermal insulation 10 are highly permeable to gases, the vacuum produced in chamber 1 by vacuum pump(s) 4 appears almost immediately in the interior of growth crucible 20. Similarly, the process gas introduced into chamber 1 from process gas(es) source 6 appears almost immediately in the interior of growth crucible 20. The process gas can be pure inert gas, such as argon (Ar) or helium (He). Alternatively, the process gas can comprise a hydrogen-including gas additive, such as hydrogen ($H_2$). Desirably, the $H_2$ content in the latter process gas is between 0 and 20%.

In a sequence typical for conventional PVT growth, RF coil 11 is energized to heat growth crucible 20 to desired temperatures of SiC sublimation growth, which is generally between 2000° C. and 2400° C. Growth crucible 20 is heated such that a vertical temperature gradient is created making the temperature of SiC source 21 higher than that of SiC seed 22. At the temperatures of SiC sublimation growth, the silicon carbide of the SiC source 21 sublimes releasing a spectrum of volatile molecular species, such as Si, $Si_2C$ and $SiC_2$. Driven by the vertical temperature gradient inside growth crucible 20, these species are transported via vapor transport 23 to SiC seed 22 where they condense on SiC seed 22 causing growth of SiC single crystal 24 on SiC seed 22.

Once SiC sublimation growth conditions are established in growth crucible 20, a flow of carrier gas 53 is introduced from a carrier gas(es) source 5 into bubbler bath 51 which is maintained at a predetermined temperature. Desirably, carrier gas 53 is pure argon (Ar) or helium (He). Alternatively, carrier gas 53 is a gas mixture comprising a hydrogen-including gas additive, such as pure hydrogen ($H_2$). Desirably, the $H_2$ content in this latter carrier gas 53 is between 0 and 20%. Desirably, the flow of carrier gas 53 does not exceed 50 sccm. In one nonlimiting embodiment, the source of carrier gas 53 can be process gas(es) source 6. However, this is not to be construed as limiting the invention since it is envisioned that carrier gas 53 can originate from a separate source, such as carrier gas(es) source 5.

Carrier gas 53 bubbles through the liquid vanadium precursor 54 disposed in the temperature-controlled bubbler bath 51. In the process of bubbling, vapor of the vanadium precursor ($VCl_4$) mixes with carrier gas 53, thus transforming said carrier gas 53 into a doping gas mixture 25. Doping gas mixture 25 is then introduced or injected into growth crucible 20 via gas line 52 and gas conduit 40.

A description of a prior art metal precursor delivery system can be found in U.S. Pat. No. 6,410,433, which is incorporated herein by reference.

It was observed that best results are obtained when the vanadium precursor 54 in bubbler bath 51 is maintained at temperatures, desirably, between 18° C. and 24° C., and the flow of carrier gas 53 bubbling through vanadium precursor 54 is maintained, desirably, between 1 and 20 sccm. However, this temperature and flow rate is not to be construed as limiting the invention. Under these conditions, the estimated content of vanadium precursor 54 in the doping gas mixture 25 is between 10 ppm and 1000 ppm by volume with carrier gas 53 being the balance.

The prior art M-PVT process (FIG. 7A) suffered from interference of the gas flow with the SiC growth process, namely gas flow supplied from gas conduit 731 disposed in close proximity to the growing crystal 724. As a result of this geometry, the grown SiC crystal 724 had unwanted and disadvantageous shapes at the growth interface, such as concave. In the embodiment shown in FIG. 9A, doping gas flows in a space 26 provided between the wall of growth crucible 20 and SiC source 21. This path for doping gas 25 flow avoids any deleterious effects that said doping gas 25 flow could have on vapor transport and crystal growth.

Figure 9B:
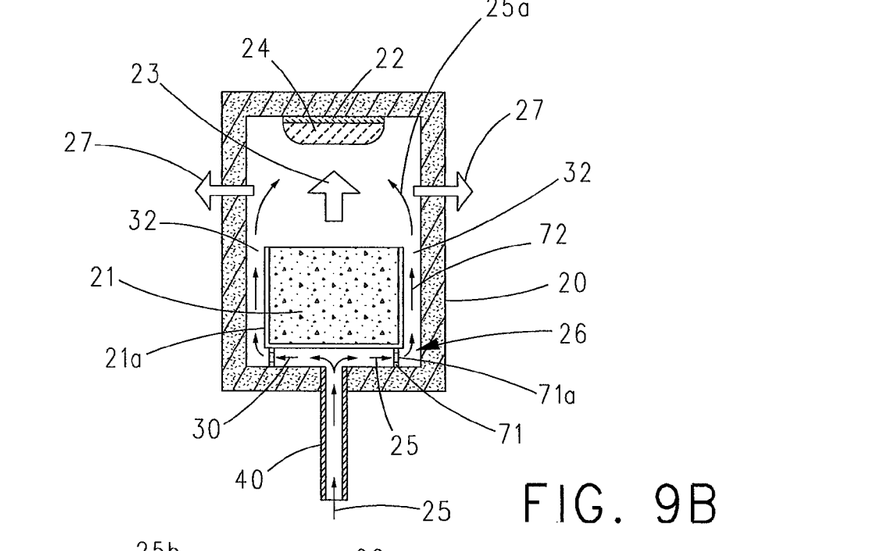
FIG. 9B is an isolated schematic view of the growth crucible of FIG. 9A including a source crucible disposed in spaced relation to interior surfaces of the growth crucible and charged with SiC source material in spaced relation to a SiC seed crystal.

One exemplary spatial relationship between growth crucible 20 and the source 21 is shown in FIG. 9B. The spatial relationship shown in FIG. 9B, however, is not to be construed as limiting the invention since it is envisioned that other spatial relationships are possible. A similar gas path geometry can be found in U.S. Pat. No. 8,361,227, which is incorporated herein by reference.

In FIG. 9B, polycrystalline SiC source material 21 is disposed in a source crucible 21a, which is disposed inside growth crucible 20 in spaced relation to interior surfaces of growth crucible 20. An exterior of a base of source crucible 21a is disposed in spaced relation to an interior floor of growth crucible 20, thereby defining a first gap 30 therebetween. First gap 30 is desirably between 2 and 10 mm wide and, more desirably, between 4 and 7 mm wide. In order to produce first gap 30, spacers 71 can be used, said spacers 71 including holes 71a allowing for the doping gas flow.

An exterior of a wall of the source crucible 21a is disposed in spaced relation to an interior of a wall of growth crucible 20, thereby defining a second gap 32 therebetween. Desirably, second gap 32 is between 2 and 10 mm wide and, more desirably, between 4 and 7 mm wide.

Doping gas mixture 25 enters growth crucible 20 via conduit 40, flows in first and second gaps 30 and 32, and delivers gaseous vanadium-bearing molecules to the growing SiC crystal 24, as shown by arrows 25a. The flow of doping gas mixture 25 in first and second gaps 30 and 32 avoids interference with the vapor transport 23 from SiC source 21 to the growing SiC crystal 24 and avoids interference with the temperature distribution in the vicinity of the growing SiC crystal 24. The path for the flow of doping gas mixture 25 in FIG. 9B avoids deleterious effects that said flow may have on vapor transport 23 and the growth of SiC single crystal 24.

Due to heat conductance from the heated growth crucible 20, the temperature in the upper portion of the gas conduit 40 is higher than in its lower portion. After entering the upper portion of gas conduit 40, the gaseous molecules of the vanadium precursor 54 ($VCl_4$) dissociate, initially into $VCl_3$. In the case when doping gas mixture 25 does not include hydrogen, the mechanism of $VCl_4$ dissociation is purely thermal, yielding monoatomic Cl as a byproduct. However, when the doping gas mixture 25 includes hydrogen, it participates in chemical reduction of $VCl_4$ to $VCl_3$ and then further to $VCl_2$, yielding HCl as a byproduct.

Upon entering growth crucible 20, doping gas mixture 25 becomes exposed to the temperatures of SiC sublimation growth, which are, generally, between 2000° C. and 2400° C. At these high temperatures, molecules of $VCl_3$ in doping gas mixture 25 transform into molecules of $VCl_2$. Where hydrogen is present in doping gas mixture 25, its presence facilitates this transformation. The $VCl_2$ molecules migrate towards growing SiC crystal 24 and adsorb on the growth interface causing doping of SiC crystal 24 with vanadium. The liberated chlorine desorbs from the growth interface and diffuses into the atmosphere of growth crucible 20.

The gaseous chlorine and hydrogen chloride (which are byproducts of vanadium halide dissociation, chemical reduction by hydrogen and doping processes) diffuse across the graphite wall of growth crucible 20 together with carrier gas 53, as shown by arrows 27 in FIGS. 9A and 9B. During their diffusion, Cl and HCl react with impurities in the graphite forming the wall of growth crucible 20. In particular, they react with boron and form volatile molecular associates with boron, such as BCl and $BCl_2$, which are removed from growth crucible 20 by the gas flow. Thus, vanadium doping of SiC using gaseous vanadium halide precursors has an additional benefit, namely, removal of unwanted impurities from growth crucible 20.

Due to the flowing of gas(es) inside growth crucible 20, the pressure inside growth crucible 20 can exceed useful limits and make SiC sublimation growth unsustainable. In order to keep the gas pressure inside growth crucible 20 within useful limits for PVT growth, the thickness of the wall of the growth crucible 20 is, desirably, between 4 and 20 mm thick, and, more desirably, between 8 and 16 mm thick.

After escaping growth crucible 20 by diffusing across the walls of growth crucible 20, the various gaseous byproducts and carrier gas 53 leave growth chamber 1 via a chamber port 3 which is coupled to vacuum pump(s) 4.

Second Embodiment

Figure 10A:
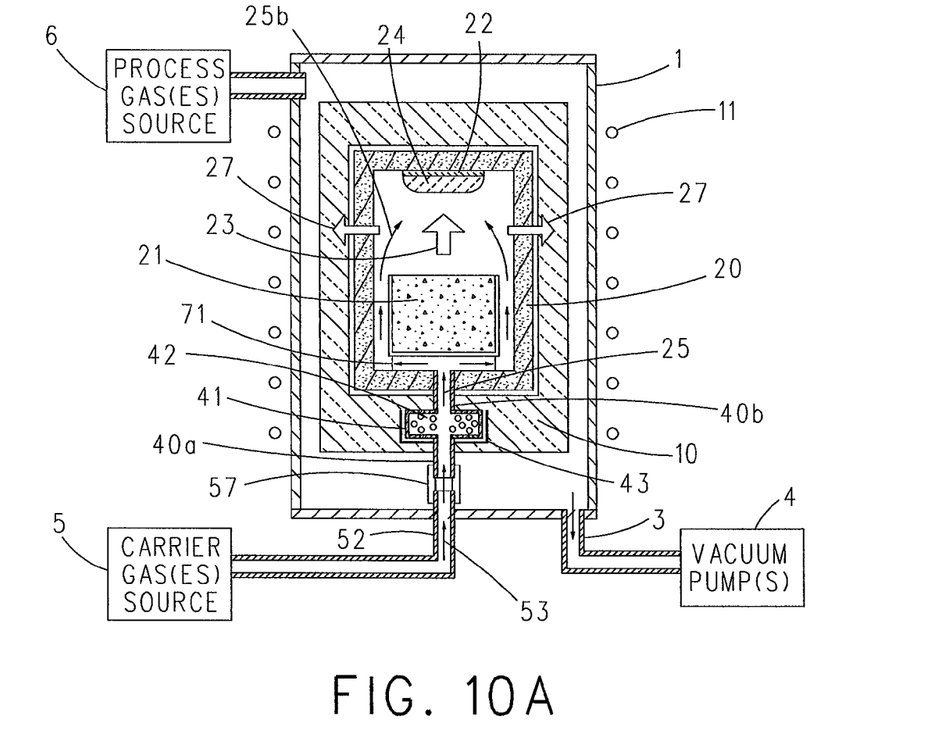
FIG. 10A is a schematic view of another embodiment growth system in accordance with the present invention.

A second embodiment growth system shown in FIG. 10A is similar in many respects to the first embodiment growth system shown in FIGS. 9A and 9B with the following exceptions: bubbler bath 51 is omitted, carrier gas 53 is introduced directly into gas line 52, and conduit 40 (comprised of upper conduit part 40b and lower conduit part 40a) includes an in-line graphite compartment 41. In similarity to the M-PVT cell shown in FIGS. 7A and 7B, conduit 40 includes graphite compartment 41 situated at a distance from growth crucible 20. Compartment 41 is charged with a solid source of vanadium 42, e.g., in the form of elemental metallic vanadium or solid vanadium compound, such as vanadium carbide (VC).

Compartment 41 can be disposed in the bulk of thermal insulation 10, as shown in FIG. 10A. In this case, heating of the compartment 41 is provided from the heated growth crucible 20 via thermal conductivity along conduit 40. Also or alternatively, thermal insulation 10 can be carved to form a well around compartment 41, whereupon at least partial heating of compartment 41 is provided by heat radiated from heated growth crucible 20. Also or alternatively, heating of the compartment 41 can be via a separate heater 43, which can be resistive or inductive. Any combination of one or more of the foregoing means of heating compartment 41 is envisioned.

After SiC sublimation growth conditions are established in growth crucible 20 by evacuation of chamber 1 via vacuum pump(s) 4 and filling of chamber 1 with process gas (e.g., Ar or He) from process gas(es) source 6 to a desired pressure between several and 100 Torr, a small flow of doping gas mixture 25 is allowed into growth crucible 20 via the upper part 40b of gas conduit 40. According to this embodiment, doping gas mixture 25 is comprised of a carrier gas 53, such as argon (Ar) or helium (He), and a halogen-including additive from carrier gas(es) source 5. Desirably, the halogen additive is gaseous halogen selected from the group of chlorine ($Cl_2$) and fluorine ($F_2$) and present in carrier gas 53 in concentrations between 10 ppm and 1000 ppm by volume. Desirably, the halogen additive is chlorine, $Cl_2$. The flow of carrier gas 53 is, desirably, less than 50 sccm and, more desirably, between 1 and 20 sccm.

Alternatively, carrier gas 53 further comprises a hydrogen-including gaseous additive, such as pure hydrogen ($H_2$), in addition to Ar or He plus the halogen additive. Desirably, the $H_2$ content in carrier gas 53 is between 0 and 20%.

After entering the lower part 40a gas conduit 40 in FIG. 10A, carrier gas 53 reaches compartment 41, which is maintained at elevated temperature. Inside compartment 41, the chlorine of carrier gas 53 reacts with vanadium of the solid vanadium source 42, forms volatile vanadium chlorides, and exits compartment 41 as doping gas mixture 25. Depending on the temperature of compartment 41, the dominating products of reaction between solid vanadium source 42 and the gaseous chlorine of carrier gas 53 are $VCl_4$ (at temperatures below 600° C.), $VCl_3$ (at temperatures between 600 and 900° C.) or $VCl_2$ (at temperatures above 900° C.).

Desirably, the temperature of compartment 41 is high enough to avoid any possible kinetic limitations that can slow down reaction between the gaseous chlorine of carrier gas 53 and the solid vanadium source 42. At the same time, the temperature of compartment 41 is low enough to avoid melting of solid vanadium source 42 (vanadium melting point is 1890° C.) and/or any possible chemical reactions between solid vanadium source 42 and the graphite forming compartment 41. Based on the aforementioned considerations, the temperature of compartment 41 is, desirably, between 1000° C. and 1600° C.

Figure 10B:
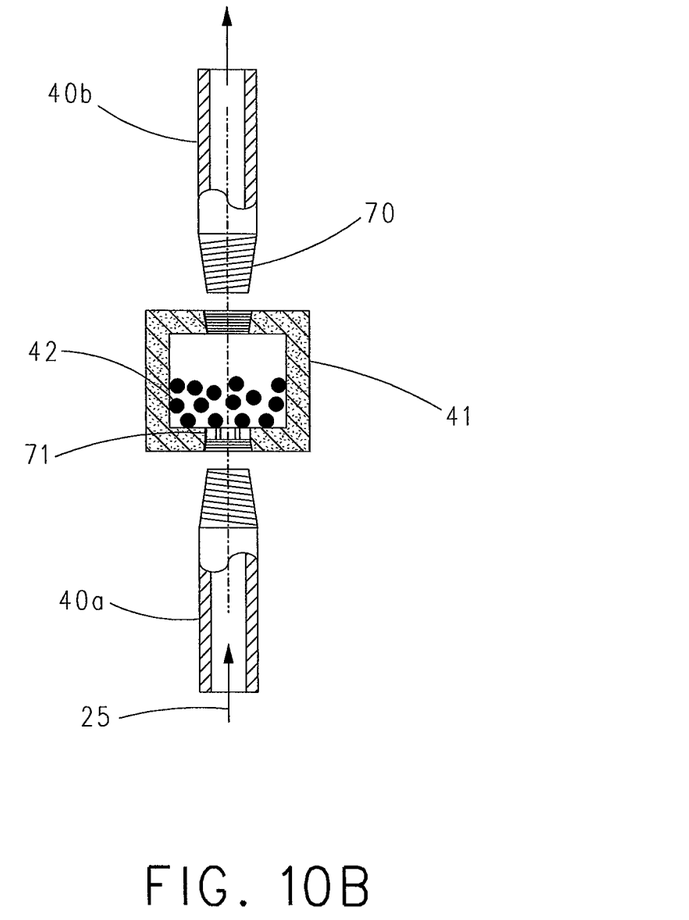
FIG. 10B is an isolated and partially exploded view of the dopant compartment and upper and lower conduits of the second embodiment doping system shown in FIG. 10A.

One exemplary design of compartment 41 is shown in FIG. 10B. However, this design of compartment 41 is not to be construed as limiting the invention since it is envisioned that other designs are possible. In the nonlimiting exemplary embodiment shown in FIG. 10B, compartment 41 is about 30 mm in diameter, about 30 mm high with a wall thickness between 6 and 10 mm. Compartment 41 and graphite conduits 40a and 40b on either side of compartment 41 have threaded connections 70. The floor of compartment 41 comprises several through holes 71, each of about 1 mm in diameter. These holes 71 provide a pathway for the flow of carrier gas 53 into the interior of compartment 41 while preventing pieces of solid vanadium source 42 from falling into lower conduit 40a. In the case when compartment 41 is buried in the bulk of thermal insulation 10, as shown in FIG. 10A, the distance between compartment 41 and growth crucible 20 is desirably between 40 and 70 mm.

Thermodynamic analysis of the ternary V—C—Cl system shows that within the preferred temperature range of 1000° C.-1600° C. of compartment 41 there are only two main products of reaction between the solid vanadium source 42 (elemental vanadium or vanadium carbide) and chlorine, namely, a higher vanadium chloride, $VCl_3$, and a lower vanadium chloride, $VCl_2$. The latter ($VCl_2$) should be present at substantially higher levels than the former ($VCl_3$). Increasing the temperature of compartment 41 from 1000° C. to 1600° C., as well as adding hydrogen to carrier gas 53 generally result in increased molecular ratio of $VCl_2$:$VCl_3$ in the gas phase of doping gas mixture 25.

When compartment 41 is maintained at a temperature within the preferred temperature range of 1000° C.-1600° C., the total amount of vanadium in doping gas mixture 25 (mostly in the form of $VCl_2$ molecules) depends only on the total amount of available chlorine. That is, the total amount of vanadium in doping gas mixture 25 is directly proportional to the concentration of chlorine in carrier gas 53 and the flow rate of carrier gas 53.

Apart from the reaction between solid vanadium source 42 in compartment 41 and the chlorine of carrier gas 53, the process of growing SiC single crystal 24 with vanadium in accordance with the second embodiment is similar to that of the first embodiment. That is, after entering growth crucible 20, which is generally maintained at temperatures between 2000° C. and 2400° C., the higher vanadium chloride $VCl_3$ dissociates into $VCl_2$ with Cl as a byproduct. In the case when hydrogen is present in carrier gas 52, this hydrogen chemically reduces $VCl_3$ to $VCl_2$ with HCl as a byproduct. The $VCl_2$ molecules migrate towards the growing SiC crystal 24 (as shown for example by arrows 25b in FIG. 10A) and adsorb on the growth interface causing doping of the SiC single crystal 24 with vanadium. The liberated chlorine desorbs from the growth interface and diffuses into the atmosphere of growth crucible 20. The halogenated gaseous byproducts and carrier gas 53 diffuse across the wall of graphite growth crucible 20 causing removal 27 of unwanted impurities from the interior and wall of graphite growth crucible 20. In this embodiment, the path for the gas flow inside the growth crucible 20 is the same or similar to that shown in FIG. 9B.

Several 6H SiC crystals 24 have been grown in accordance with the two embodiment growth cells described herein. In the growth runs carried out in accordance with the first embodiment growth cell, $VCl_4$ disposed in a controlled temperature bubbler bath 51 was used as a volatile liquid vanadium precursor 54. The $VCl_4$ bath was maintained at temperatures between 18° C. and 30° C., and pure argon was used as the carrier gas 53 flowing at rates between 1 and 20 sccm.

In the growth runs carried out in accordance with the second embodiment growth cell described herein, pure metallic vanadium was used as the solid vanadium source 42. Vanadium pieces were disposed in graphite compartment 41 similar to that shown in FIG. 10B. Compartment 41 was maintained at a temperature around 1400° C. in all growth experiments. Argon pre-mixed with 500 ppm of Cl, was used as carrier gas 53 and its flow rate was varied between 1 and 20 sccm.

6H SiC single crystals 24 grown in accordance with either embodiment growth cell were manufactured into standard on-axis wafers, 100 mm in diameter and 500 microns thick. Representative wafer samples were selected and the vanadium content in them was measured using the method of Secondary Ion Mass Spectroscopy (SIMS). The measured values were within the range between $2 \cdot 10^{15}$ and $1 \cdot 10^{17}$ atoms-$cm^{-3}$. As a general trend, the vanadium concentration in the grown crystals increased with increase in the vanadium chloride content in the carrier gas 53 and with increase in the flow rate of the carrier gas 53.

The lowest vanadium concentration of $2 \cdot 10^{15}$ atoms-$cm^{-3}$ was measured in the sample grown in accordance with the second embodiment growth cell when the flow rate of the Ar+$Cl_2$ carrier gas 53 was 1 sccm. The highest usable vanadium concentration of $1 \cdot 10^{17}$ atoms-$cm^{-3}$ was measured in the sample grown in accordance with the first embodiment growth cell when the $VCl_4$ bath was maintained at 24° C. and the flow rate of the carrier gas 53 (i.e., argon) was 20 sccm.

Increase in the temperature of the bath 51 beyond 24° C. and increase in the flow of carrier gas 53 beyond 20 sccm led to the appearance of vanadium precipitates in the grown SiC crystals 24.

The obtained SIMS results showed excellent spatial uniformity of vanadium doping in both axial and radial directions. In all SiC single crystals 24 grown in accordance with either embodiment growth cell and analyzed by SIMS, variations in the vanadium concentration were within ±10% from the ingot's mean value.

The SIMS results obtained on the SiC single crystals 24 grown in accordance with either embodiment growth cell showed very low concentrations of background boron, equal or below $4 \cdot 10^{15}$ atoms-$cm^{-3}$.

The present invention has been described with reference to the accompanying figures. Obvious modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A method of growing a vanadium-doped SiC single crystal by sublimation comprising:
   (a) providing a growth crucible having SiC source material and a SiC single crystal seed in spaced relation therein;
   (b) heating the growth crucible of step (a) to a temperature between 2000° C. and 2400° C. causing the SiC source material to sublime;
   (c) forming a temperature gradient between the SiC source material and the SiC single crystal seed that causes the sublimated SiC source material to be transported to and precipitate on the SiC single crystal seed thereby growing a SiC crystal on the SiC single crystal seed; and
   (d) concurrent with step (c), introducing into the growth crucible from a location outside the growth crucible a doping gas mixture that includes a gaseous vanadium chemical compound that, in response to entering the growth crucible heated to the temperature between 2000° C. and 2400° C., undergoes thermal dissociation, chemical reduction, or both, releasing into the growth crucible gaseous dissociation products, reduction products, or both which are absorbed on a growth interface of the growing SiC crystal thereby doping the growing SiC crystal with vanadium.

2. The method of claim 1, wherein the gaseous vanadium chemical compound includes a halogen.

3. The method of claim 2, wherein the gaseous vanadium chemical compound is vanadium chloride ($VCl_n$), where n=2, 3, or 4.

4. The method of claim 1, wherein the doping gas mixture includes a carrier gas.

5. The method of claim 4, wherein the carrier gas includes an inert gas, hydrogen, or both.

6. The method of claim 4, wherein the carrier gas includes a halogen additive selected from the group of chlorine and fluorine.

7. The method of claim 4, wherein:
   the gaseous vanadium chemical compound is vapors of the $VCl_n$; and
   the doping gas mixture is comprised of the $VCl_n$ vapors mixed with the carrier gas.

8. The method of claim 7, wherein the $VCl_n$ vapors are mixed with the carrier gas by passage of the carrier gas through a pool of liquid $VCl_n$.

9. The method of claim 7, wherein the $VCl_n$ vapors are mixed with the carrier gas by passage of the carrier gas that includes chlorine over the surface of a heated solid vanadium source located outside the growth crucible.

* * * * *